US006872654B2

(12) United States Patent
Chen et al.

(10) Patent No.: US 6,872,654 B2
(45) Date of Patent: Mar. 29, 2005

(54) METHOD OF FABRICATING A BISMALEIMIDE (BMI) AS A SACRIFICAL MATERIAL FOR AN INTEGRATED CIRCUIT AIR GAP DIELECTRIC

(75) Inventors: Tian-An Chen, Phoenix, AZ (US); Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 10/330,619

(22) Filed: Dec. 26, 2002

(65) Prior Publication Data

US 2004/0124495 A1 Jul. 1, 2004

(51) Int. Cl.[7] .......................................... H01L 21/4763
(52) U.S. Cl. ...................... 438/633; 438/692; 438/780
(58) Field of Search ............................... 438/631, 633, 438/691, 692, 697, 778, 780, 781, 619; 257/499, 506, 522; 29/825, 829

(56) References Cited

U.S. PATENT DOCUMENTS 5,480,048 A * 1/1996 Kitamura et al. ............. 216/13
5,707,749 A * 1/1998 Katagiri et al. ........... 428/473.5
2003/0145458 A1 * 8/2003 Tani et al. ..................... 29/830
2004/0080052 A1 * 4/2004 Ou et al. ..................... 257/774

\* cited by examiner

Primary Examiner—Alonzo Chambliss
(74) Attorney, Agent, or Firm—Ami Patel Shah

(57) ABSTRACT

A method for implementing a bismaleimide (BMI) polymer as a sacrificial material for an integrated circuit air gap dielectric. The method of one embodiment comprises forming a first and second metal interconnect lines on a substrate, wherein at least a portion of the first and second metal interconnect lines extend parallel to one another and wherein a trough is located between the parallel portion of said first and second metal interconnect lines. A layer of bismaleimide is spin coated over the substrate. The layer of bismaleimide is polished with a chemical mechanical polish, wherein the trough remains filled with the bismaleimide. A diffusion layer is formed over the substrate. The substrate is heated to activate a pyrolysis of the bismaleimide. An air gap is formed in the trough in the space vacated by the bismaleimide.

19 Claims, 8 Drawing Sheets

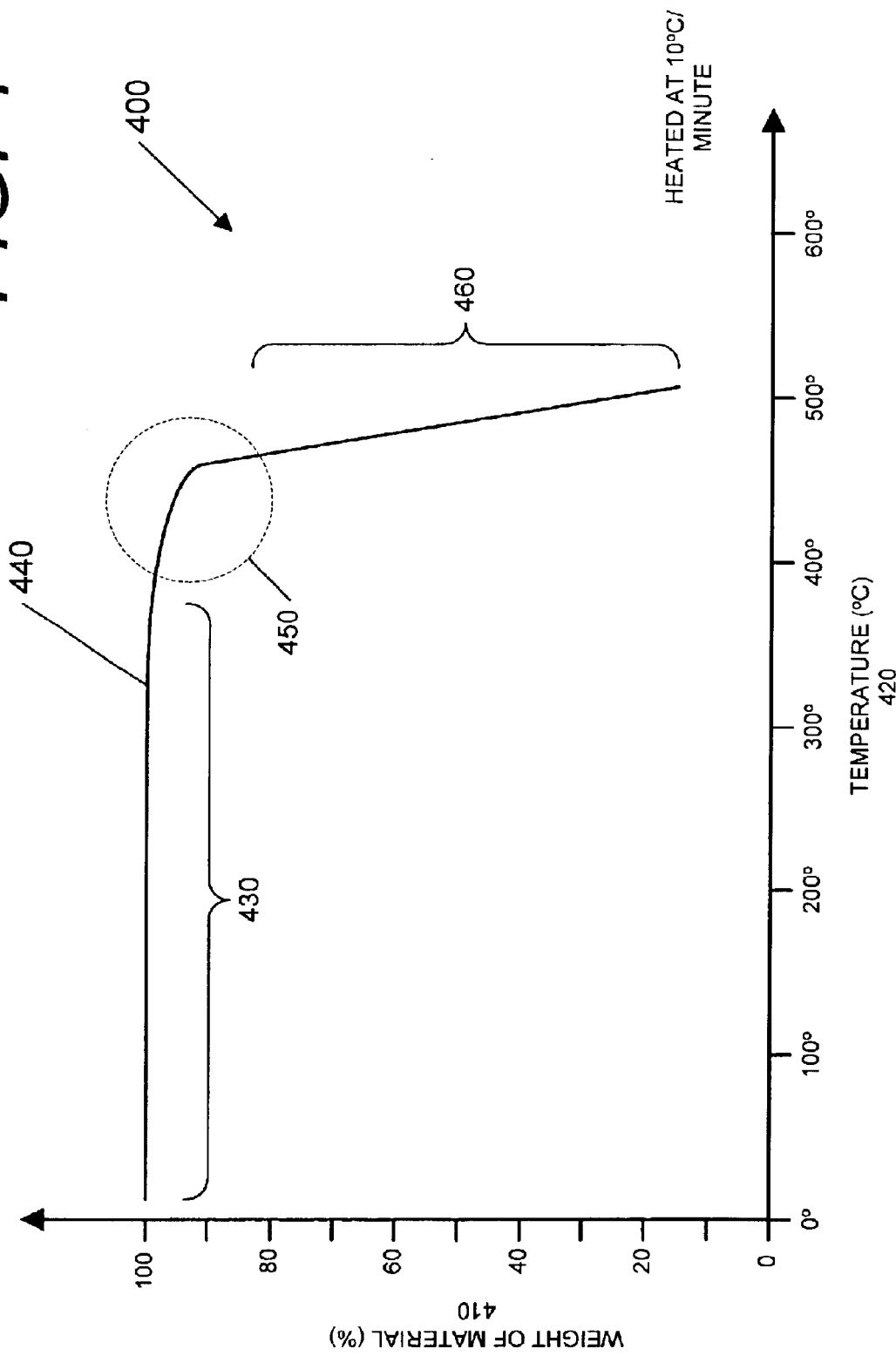

METHOD OF FABRICATING A BISMALEIMIDE (BMI) AS A SACRIFICAL MATERIAL FOR AN INTEGRATED CIRCUIT AIR GAP DIELECTRIC

FIELD OF THE INVENTION

The present invention relates generally to the field of semiconductor manufacturing and processing. More particularly, the present invention relates to a method and apparatus for a implementing a bismaleimide (BMI) polymer as a sacrificial material for an integrated circuit air gap dielectric.

BACKGROUND OF THE INVENTION

Semiconductor process technology has been making many advancements over the recent years. As a result, device sizes and dimensions have been dramatically reduced. Some developments enable electronic circuits such as computer and instrumentation circuits to become extremely fast and powerful. But as the device features continue to shrink, the distance between conductive lines also decreases, creating the need for a dielectric with a lower dielectric constant (k). Presently, chemical vapor deposition (CVD) types of dielectrics such as Carbon Doped Oxide (CDO) that has a dielectric constant of greater than 3.0 are being used. Similarly, current interconnect interlayer dielectric (ILD) schemes use either SiO2 based films (e.g., OSG "CDO" or SiOF formulations) or so called low k organic or inorganic polymer films (e.g. SILK™, FLARE™, GX3™, MSQ, and HSQ). These ILD films are formulated to be either solid or porous filled. The porous films can have a lower k based on the higher 'air' content. The range of k for these films can range from 4.2 to 2.2. Thus, the current generation of ILD films would not meet the less than 2.0 k requirements of newer semiconductor devices.

Certain low k (dielectric constant) materials have been proposed, including various carbon containing materials, e.g., organic polymers and carbon doped oxides. Although such materials may serve to lower the dielectric constant, they may offer inferior mechanical properties, such as poor mechanical strength or susceptibility to cracking. Accordingly, there is a need for a semiconductor device that includes a air gap dielectric that can insulate adjacent conductive lines. In addition, there is a need for a process for making such a device.

BRIEF DESCRIPTION OF THE DRAWINGS

The present invention is illustrated by way of example and not limitations in the figures of the accompanying drawings, in which like references indicate similar elements, and in which:

FIG. 4 is a graph illustrating the decomposition curve of BMI in accordance with one embodiment of the present invention;

DETAILED DESCRIPTION

Figure 1A:
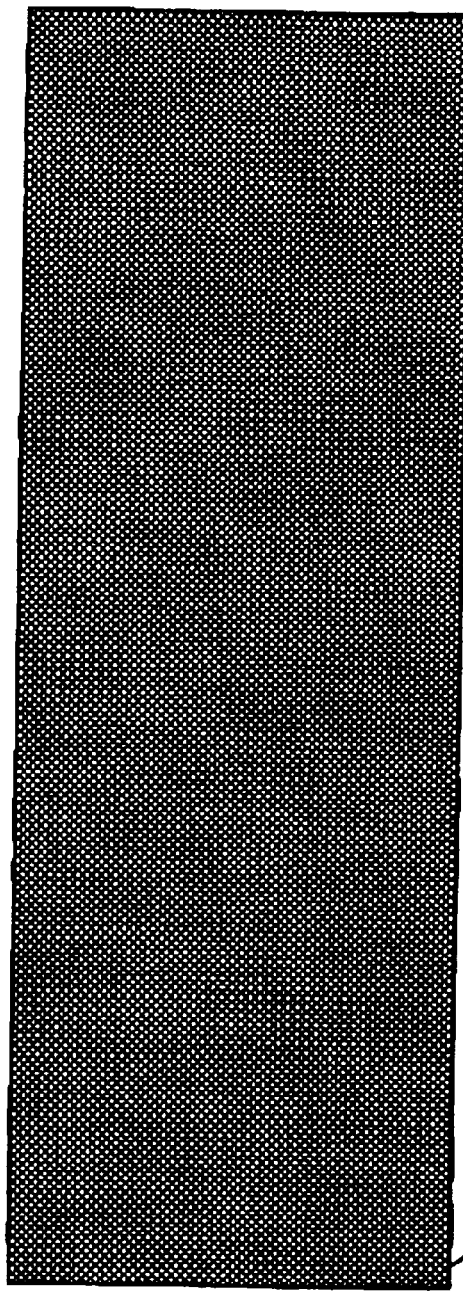
FIG. 1A is an overhead view of a semiconductor device in accordance with one embodiment of the present invention.

A method and apparatus for implementing a bismaleimide (BMI) polymer as a sacrificial material for an integrated circuit air gap dielectric is disclosed. The embodiments described herein are described in the context of a microprocessor, but are not so limited. Although the following embodiments are described with reference to a processor, other embodiments are applicable to other types of integrated circuits and logic devices. The same techniques and teachings of the present invention can easily be applied to other types of circuits or semiconductor devices that can benefit from a dielectric with a lower dielectric constant k and improved performance. The teachings of the present invention are applicable to any semiconductor manufacturing process that fabricates devices with air gap dielectrics. However, the present invention is not limited to a particular type of bismaleimide (BMI) polymer and can be applied to other types of BMI compounds.

In the following description, for purposes of explanation, numerous specific details are set forth in order to provide a thorough understanding of the present invention. One of ordinary skill in the art, however, will appreciate that these specific details are not necessary in order to practice the present invention. In other instances, well known electrical structures and circuits have not been set forth in particular detail in order to not necessarily obscure the present invention.

As the dimensions of semiconductor structures continue to shrink with newer processing technologies, the characteristics of the materials become more stringent. Because of the smaller device sizes, operating frequencies of resulting integrated circuits have increased exponentially. However, the faster signal switching and communication rates have led to a whole host of new issues. One issue involves the interference and noise generated by adjacent signal routing lines. Thus high speed switching of signals can cause errors in the transmissions. Although certain types of dielectrics are used to separate signal lines, these dielectrics often higher than desired dielectric constants k. If higher k dielectric material is placed between two high speed signals, the signals would be dramatically slowed down by the resistance-capacitance RC delays that is inherent to the adjacent lines and nearby signals from other layers in the semiconductor device.

This issue has lead to a need for a lower k (<2.0) dielectric solution for the newer integrate circuit products. Embodiments of the present invention employ a polymer based film as an element of a thermally decamping integration scheme to create an air gap. The term 'air gap' is used here in reference to any architecture scheme which has more air than material in the trench interlayer dielectric (ILD) or via ILD. The air in the gap serves as the primary dielectric between the signal lines. Thus the dielectric material separating BMI materials can also be used as sacrificial material to create micro electromechanical system (MEMS) structures. Ideally, an air gap solution would be a gap between materials filled solely with air as the installation of material.

However, very few materials are available to meet the process challenge in order to form air gaps. BMI is a class materials that possesses a number of desirable properties relating to processing abilities, film uniformity, thermal stability, and decomposition characteristics. Embodiments of the present invention provide such a semiconductor device and a process for using a BMI polymer as a sacrificial material in making an air gap dielectric device. For one embodiment, a new material system of sacrificial material is applied to the processing of air gap in integrated circuits inter-metal dielectrics (IMD) and its process. This material system includes bismaleimide (BMI), and its monomers, oligomers, polymers, and copolymers. The system further includes their formulation and ingredients used in their formulation including solvents, coupling agent, adhesion promoter, toughing agent, surfactant for surface wetting improvement, and catalyst for thermal or UV curing. For one embodiment, this BMI material system can be deposited between adjacent metal lines, where the BMI remains stable through most of the semiconductor processing steps. In one embodiment, the catalyst for the BMI is activated in all of the previous layers after the interconnect layers are in place. The BMI will decompose and leave an air gap. By using an air gap as an IMD, the dielectric constant can be reduced to as low as the k of air, '1'.

A lower k IMD can help to reduce the coupling capacitance between interconnects. Propagation delay and signal faults due to crosstalk can also be limited with the lower k IMD. The BMI class of compounds possesses many desirable properties for meeting the air gap processing requirements. For instance, compounds of a BMI class of materials for one embodiment have characteristics such as being spin-coat-able, having an amorphous phase for film uniformity and phase continuity (for cracking resistivity during metal/ILD/etch-stop), high thermal stability for thin film processing, a desired high decomposition temperature, a desired decomposition rate, and a desired residue level for the formation of an air gap.

The term 'BMI' generally describes a class of compounds. Some example chemical structures are described further below. For discussion purposes, the term 'xBMI' is used below in referring to one type of BMI material as one example. However, embodiments of the present invention can be used with the whole class of BMI compounds. The following table 'TABLE 1' outlines some of the properties found in a BMI material.

TABLE 1

Example BMI Properties

| Characteristic | BMI Property |
| --- | --- |
| Chemistry | Bismaleimide functional monomer or oligomer |
| Viscosity (R.T. cps) | 2000 |
| Curing condition | >200° C. or UV cure |
| Cross linking | free radical reaction |
| Modulus (Mpa) | 20 |
| Solid phase | Thermosetting amorphous |
| Film color | Clear or light yellow tint |
| Thermal stability | <1% weight loss at 300° C. |
| Decomposition temp (° C.) | 350–450° C. |

Figure 1B:
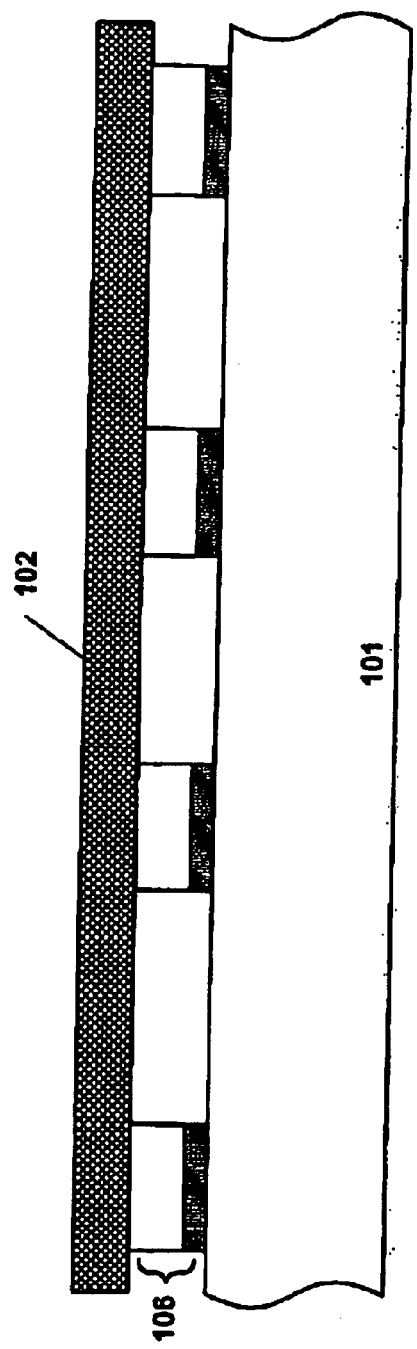
FIG. 1B is a cross sectional view of the semiconductor device of FIG. 1A.

An example of a semiconductor structure with air gap dielectrics produced with a type of BMI in accordance with the present invention is shown in FIGS. 1A and 1B. One embodiment of this invention involves the use of BMI material as a sacrificial ILD layer in order to create a space of air between metal interconnect lines. By using an air gap as the inter-metal dielectric, the coupling capacitance between interconnections can be reduced in order to limit the amount of propagation delay and signal faults due to crosstalk in sub 0.1 micron integrated circuits. The use of the BMI material as a sacrificial film in the process steps, the formation of air gaps within integrated circuit structures on wafers becomes more feasible. The BMI material in embodiments of the present invention can act as a template for metal dual damascene processing and is later removed by thermal evaporation of the metal lines.

The air gaps between metal lines in an integrated circuit can be generated by pre-spinning a thin BMI polymer film on the wafer, patterning the film, and eventually thermally decomposing this thin film polymer in the integrated circuit structure. Specifically, the BMI polymer will be used as a polymer ILD for the creating of metal interconnects. In some embodiments, the interconnects can either be made by a damascene technique or a direct patterning process. The BMI material selected for this purpose can meet many of the special requirements in terms of solution, film, and thermal-mechanical properties. BMI belongs to a class of bismaleimide function group that have the property of being neat in liquid, solid at room temperature, and dissolvable in a solvent to form a formulation that can be spun onto a wafer. The BMI type of materials is amorphous in nature and can be cross linked to form a uniform thin film by thermal or ultraviolet (UV) curing. The cured BMI film possesses a high thermal stability and low out-gassing at high temperature. Yet BMI has low stress (a low modulus) and the mechanical strength to withstand the subsequent wafer processing steps. The BMI film of one embodiment has a desired decomposition temperature range wherein the film is decomposed at around 400° C. The BMI compound stays in a solid state and has little weight loss up to greater than 300° C. The pyrolysis behavior of the BMI of this embodiment is such that the BMI is quickly decomposed within a decomposition temperature range of 350–450° C. After the decomposition, the BMI of this embodiment leaves minimal or no pyrolysis residue in the air gap formation regions. Upon pyrolysis, the sacrificial BMI polymer of one embodiment decomposes into a series of small gas molecules which can diffuse out of an over layer, thus leaving an air gap between the lines in the structure where the BMI was located. For alternative embodiments, the temperature ranges and values can vary, but the sacrificial film material exceeds similar decomposing properties to leave behind air gap regions.

Figure 2A:
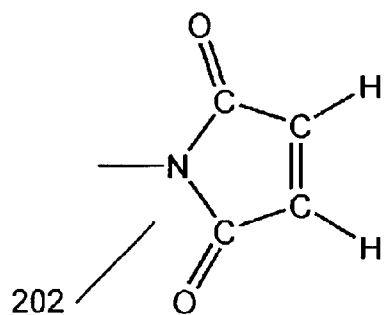
FIGS. 2A–B are diagrams of Lewis structures for maleimide groups.
Figure 2B:
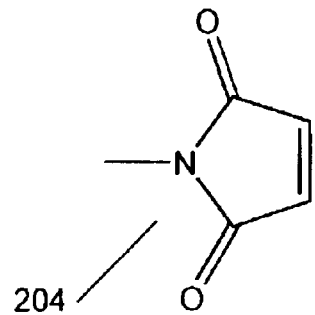
Figure 2C:
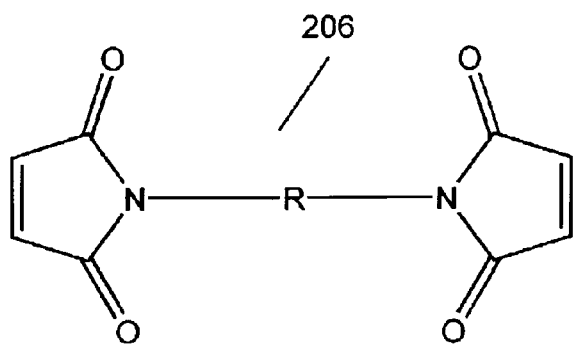
FIG. 2C is a diagram of a Lewis structure for a generic bismaleimide (BMI) of one embodiment.
Figure 2D:
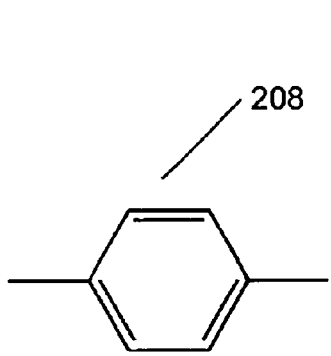
FIGS. 2D–I are diagrams of Lewis structures for various hybride moieties and corresponding resultant bismaleimide structures.
Figure 2E:
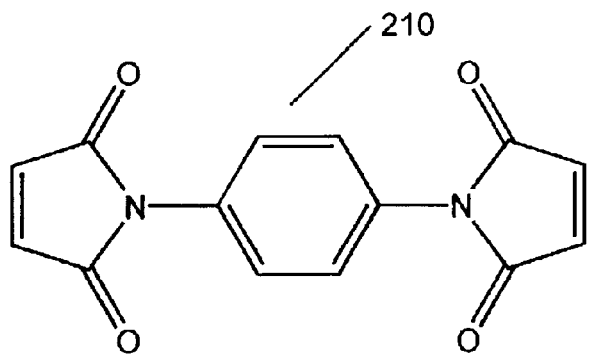
Figure 2F:
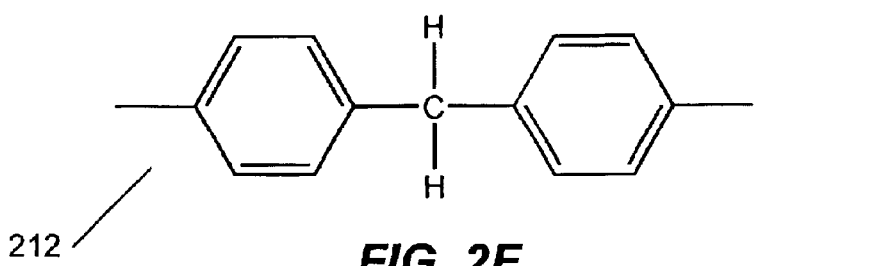
Figure 2G:
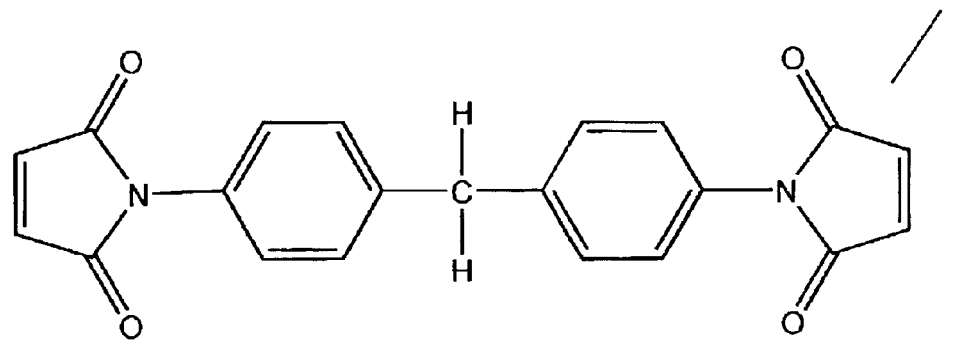
Figure 2H:
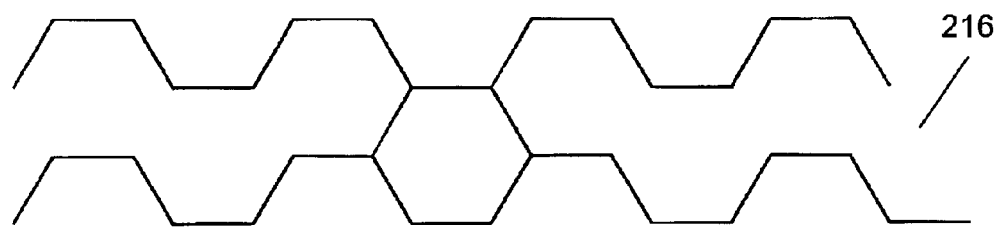
Figure 2I:
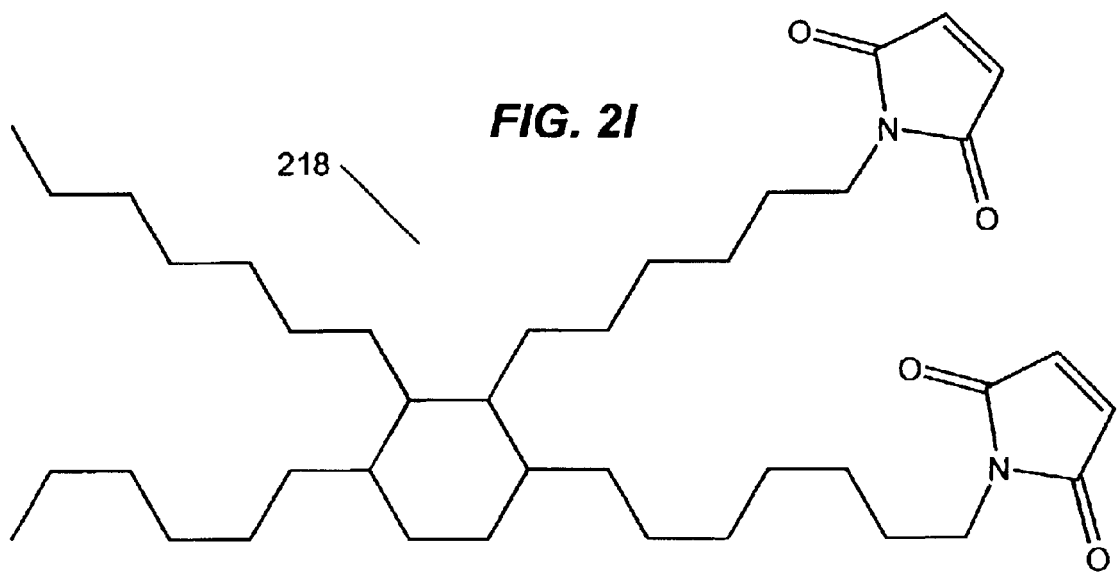

FIGS. 2A–I are different diagrams of Lewis structures for general BMI compound examples for one embodiment of the present invention. Although a limited number of BMI structures are shown, embodiments of methods in accordance to the present invention are not necessarily limited to these, and the methods can be applied to a general class of BMI compounds. In order to be able to process the BMI polymer in the backend of the semiconductor manufacturing process for one embodiment, the BMI has to decompose between 300–500° C. FIGS. 2A–B are diagrams of Lewis structures for maleimide groups 202, 204. Bismaleimide is an organic compound comprised of two maleimide groups. BMI is a class of organic compounds having the generic structure as show in FIG. 2C. FIG. 2C is a diagram of a Lewis structure for a generic bismaleimide (BMI) 206 of one embodiment. The 'R' linking group component of the generic BMI 206 can be an aromatic, or aliphatic, or aromatic and aliphatic, hybride organic or organic-inorganic hybride moiety containing 6 to 50 carbon atoms.

FIGS. 2D–I are diagrams of Lewis structures for various hybride moieties and corresponding resultant BMI structures. If component 'R' of the generic structure 206 is substituted with a hybride moiety structure 208 of FIG. 2D, the BMI compound is represented by the structure 210 of FIG. 2E. Similarly, for the hybride moiety structure 212 of FIG. 2F as component 'R', the BMI compound is represented by the structure 214 of FIG. 2G. When 'R' is the structure 216 of FIG. 2H, the resulting BMI compound has the structure 218 of FIG. 2I. The BMI structures described here are examples of some possible BMI compounds and are in no sense restrictive. A number of other BMI structures are possible and embodiments of the present invention can be used in conjunction with the whole class of BMI compounds.

Figure 3A:
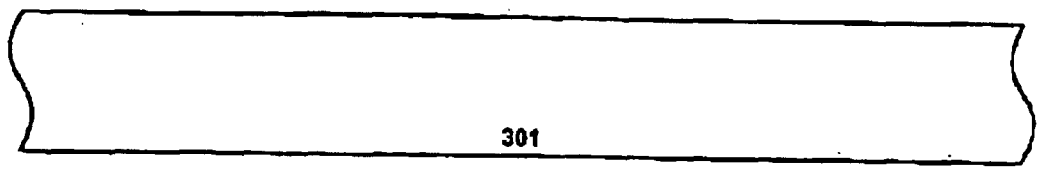
FIGS. 3A–H are illustrations of a cross sectional views that can result when making a semiconductor device in accordance with an embodiment of a method of the present invention.
Figure 3B:
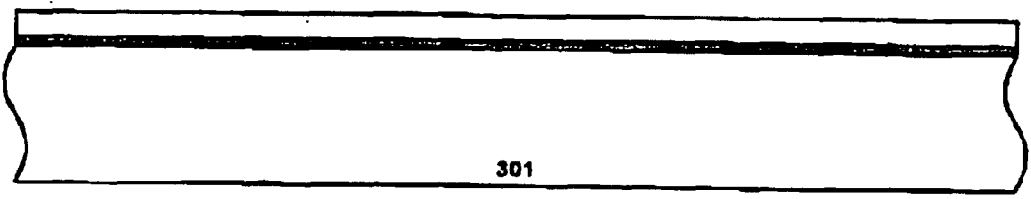
Figure 3C:
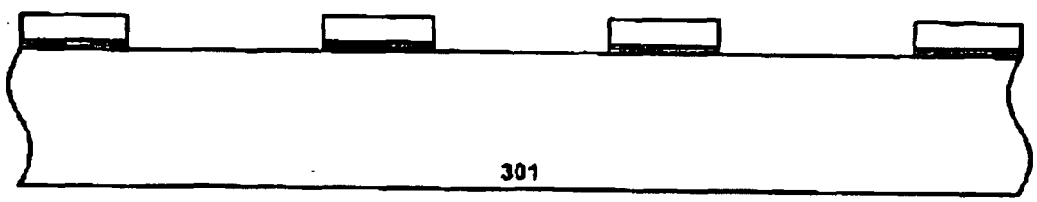
Figure 3D:
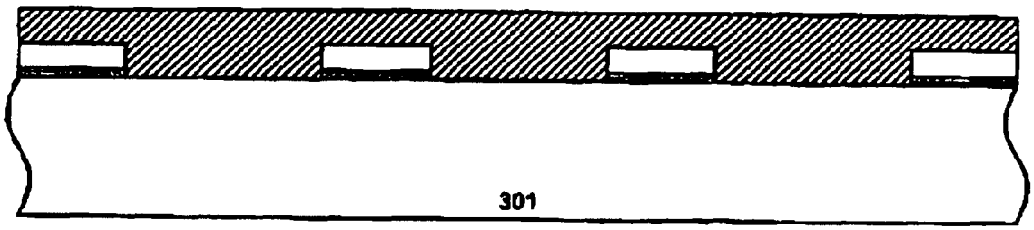
Figure 3E:
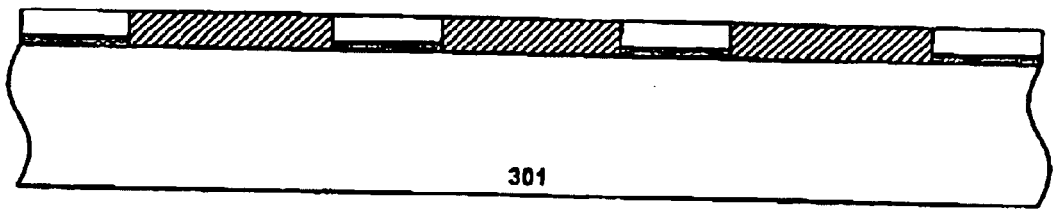
Figure 3F:
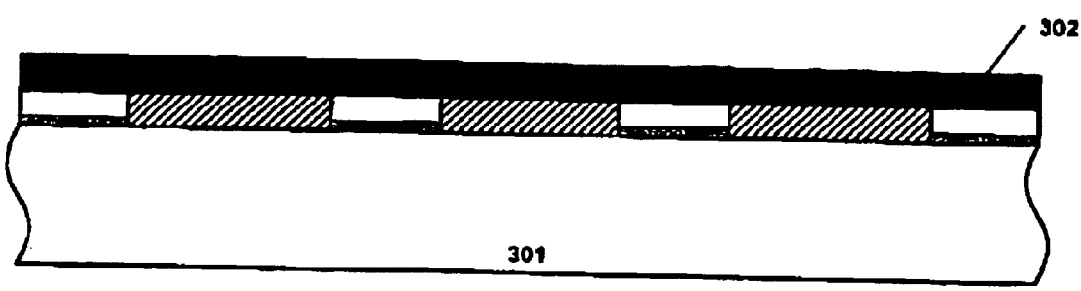
Figure 3G:
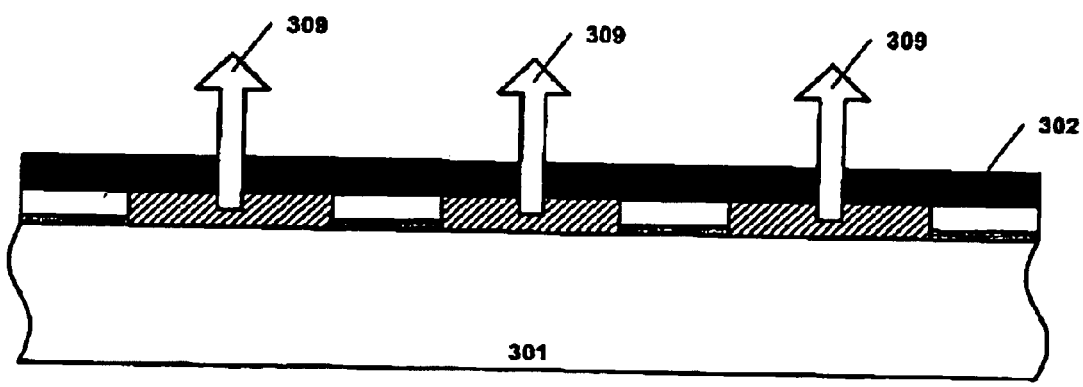
Figure 3H:
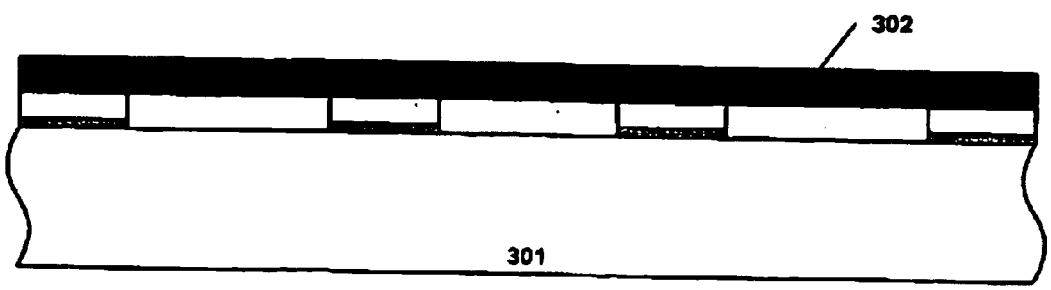

A method of forming air gap dielectric regions in an integrated circuit in accordance with embodiments of the present invention will be explained with respect to cross sectional view show in FIGS. 3A–H. This example illustrates one embodiment for integrating the BMI material into semiconductor processing steps to form air gaps. According to the present invention, a silicon substrate 301 is provided on which air gap dielectric regions is to be fabricated as shown in FIG. 3A.

FIG. 4 is a graph 400 illustrating the kinetic decomposition curve 440 with a 10° C./minute temperature ramp rate for a BMI cross linking polymer in accordance with one embodiment of the present invention. For this example, the kinetic decomposition curve is described in the context of a sample BMI material. Other related chemical groups in the BMI and maleimide class of materials having similar type of characteristics can be used in forming air gaps. For example, the various BMI compounds from FIGS. 2E, 2G, and 2I, from above can have similar characteristics and similar decomposition curves. Thus these other BMI polymers can be used in alternative embodiments. This graph 400 plots the percentage weight 410 of an BMI polymer material over a range of temperatures in Celsius (° C.) 420. Line 440 represents the kinetic decomposition curve of a sample BMI material for one embodiment as the material is heated up at a ramp rate of 10° C. per minute. The transition points of this curve 440 are based on this condition. For instance, if the material film of this example is heated isothermally at 400° C., the material will start to decompose and continue to decompose until the residue at this isothermal temperature. As shown by the linear region 430 of line 440, the weight of the polymer is fairly linear over temperature up to just below 400° C. such that the polymer is stable enough for processing. Around 400° C., a knee 450 in the decomposition curve 440 develops, indicating that the BMI polymer is decreasing in weight and changing due to the increasing temperature. The material begins to decompose dramatically as temperature continues to increase towards 460° C. and beyond at a second linear region 460 of the curve 440. Thus as shown in FIG. 4, the BMI transitions to a gaseous state after a certain trigger temperature, so that the BMI can be easily removed from the semiconductor and still leave air gap regions to serve as dielectrics in the structures. The BMI material of one embodiment has a decomposition residue property wherein less than 5% residue is left after pyrolysis decomposition above 400° C. For another embodiment, the less than 5% decomposition residue characteristic applies above 500° C. The decomposition of the BMI polymer can be performed in different environments such as an air purge or a nitrogen purge, for example.

Figure 5:
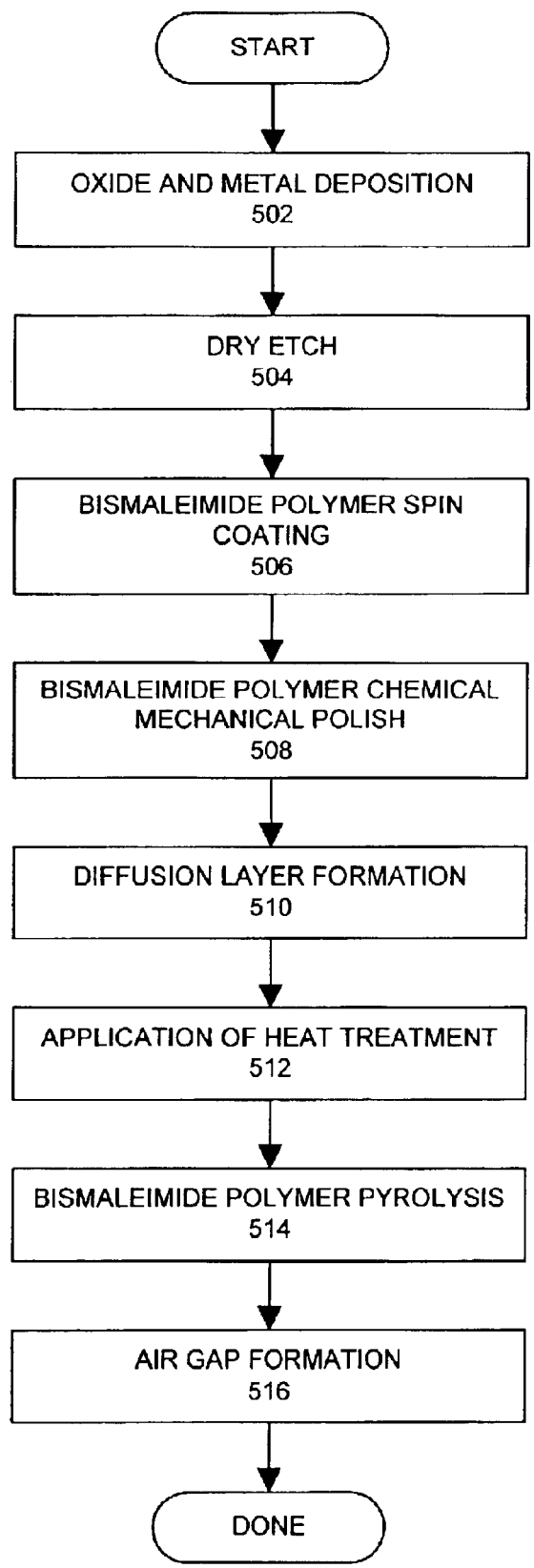
FIG. 5 is a flow chart illustrating one embodiment of a method of using a BMI polymer as a sacrificial material in forming an air gap dielectric in an integrated circuit.

FIG. 5 is a flow chart 500 illustrating one embodiment of a method of using a BMI polymer as a sacrificial material in forming an air gap dielectric in an integrated circuit. This method is commonly referred to as a direct patterning process. At block 502, an oxide layer and a metal layer are deposited onto a silicon substrate. A dry etch is performed on the oxide and metal layers at block 504. A bismaleimide polymer is spin coated onto the wafer at block 506. The bismaleimide polymer undergoes a chemical mechanical polish at block 508 to planarized and level the bismaleimide layer. A diffusion barrier layer is formed at block 510 over the wafer. The wafer is heated at block 512 to activate the decomposition of the bismaleimide material. The bismaleimide polymer undergoes a pyrolysis at block 514 wherein the bismaleimide material transitions to a gaseous state. The bismaleimide diffuses through the diffusion layer and air gaps are formed at block 516 where the bismaleimide had previously resided.

Figure 6:
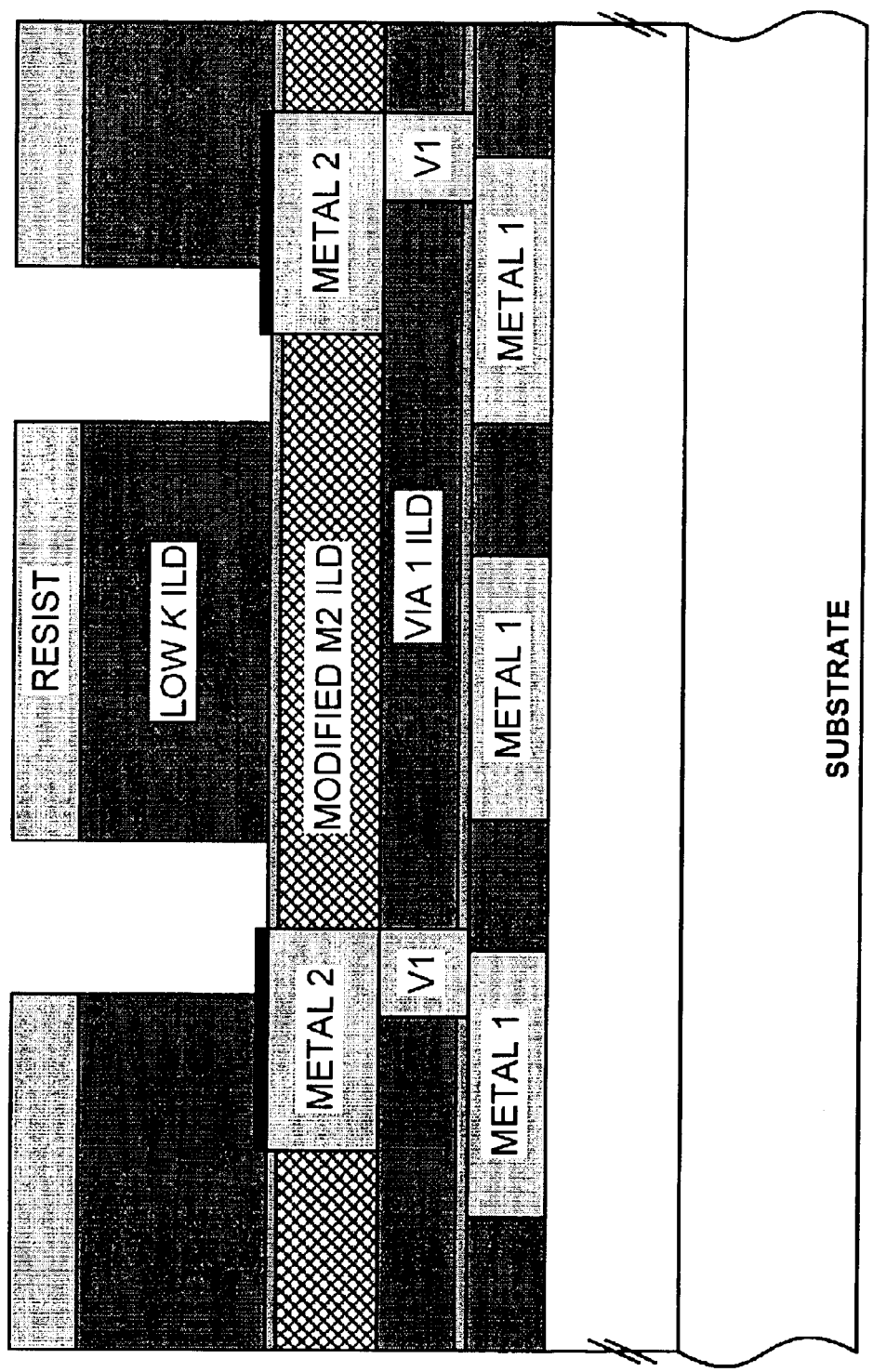
FIG. 6 is a cross sectional view of a semiconductor device in accordance with another embodiment of the present invention.

FIG. 6 is a cross sectional view of a semiconductor device in accordance with another embodiment of the present invention. In accordance with the present invention, embodiments use BMI material during semiconductor processing to ultimately form air gap regions in the metal 2 (M2) ILD region. Similarly, the BMI material can also be used to form air gap regions in the via 1 (V1) ILD regions. In other embodiments, air gaps can be formed in other materials and layers through the use of BMI material.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method for forming an integrated circuit comprising:
   forming a first and second metal interconnect lines on a substrate, wherein at least a portion of said first and second metal interconnect lines extend parallel to one another and wherein a trough is located between said parallel portion of said first and second metal interconnect lines;
   spin coating a layer of bismaleimide over said substrate;
   polishing said layer of bismaleimide with a chemical mechanical polish, wherein said trough remains filled with said bismaleimide;
   forming a diffusion layer over said substrate; and
   heating said substrate to activate a pyrolysis of said bismaleimide.

2. The method of claim 1 wherein said pyrolysis causes said bismaleimide to transition physical states from a solid form to a gaseous form.

3. The method of claim 2 further comprising diffusing gas molecules of said bismaleimide through said diffusion layer, said diffusion layer sufficiently porous to allow said gas molecules to pass through.

4. The method of claim 3 wherein substantially all of said bismaleimide in said trough is removed and forming an air gap in said trough in space vacated by said bismaleimide.

5. The method of claim 4 further comprising forming a support layer over said diffusion layer to prevent said air gap in said trough from being collapsed upon.

6. The method of claim 5 wherein said bismaleimide has a thermal stability property wherein less than 1% weight loss occurs in said bismaleimide below 300° C.

7. The method of claim 6 wherein said bismaleimide further comprises a decomposition temperature of between 350° C. to 450° C.

8. The method of claim 7 wherein said bismaleimide further comprises a decomposition residue property wherein less than 5% residue is left after complete decomposition from said pyrolysis at above 400° C.

9. The method of claim 8 wherein decomposition of said bismaleimide during said pyrolysis occurs in a nitrogen purge atmosphere.

10. The method of claim 9 wherein said air gap serves as a dielectric between said first and second metal lines, said air gap having a dielectric constant k of approximately equal to 1.

11. The method of claim 8 wherein decomposition of said bismaleimide during said pyrolysis occurs in a air purge atmosphere.

12. A method for forming an integrated circuit comprising:
   forming a plurality of signal lines on a substrate, said signal lines to be separated with a dielectric material to prevent errors that can result from signal transitions in nearby signal lines;
   forming troughs in locations where said dielectric material is be located;
   spin coating a thin film of bismaleimide over said substrate, wherein said troughs are filled with said bismaleimide;
   planarizing and polishing said thin film of bismaleimide, wherein said troughs remain filled with said bismaleimide;
   forming a diffusion layer over said substrate; and
   applying heat to cause a pyrolysis and decomposition of said bismaleimide.

13. The method of claim 12 further comprising transforming said physical state of bismaleimide from a solid state to a gaseous state.

14. The method of claim 13 further comprising diffusing gas molecules of said bismaleimide through said diffusion layer.

15. The method of claim 14 wherein said signal lines are metal routing lines.

16. The method of claim 15 wherein said pyrolysis and diffusion causes substantially all of said bismaleimide to be removed from said troughs and forms air gaps in space vacated by said bismaleimide in said trough, said air gaps to function as a dielectric between said plurality of signal lines.

17. The method of claim 16 wherein said bismaleimide includes physical properties comprising:
   a film process ability wherein said bismaleimide can be spun onto a surface;
   film uniformity wherein said bismaleimide is amorphous;
   thermal stability wherein said bismaleimide maintains a solid state and has minimal weight loss up to at least 300° C.;
   a decomposition temperature above 350° C.; and
   low residue level after decomposition.

18. The method of claim 16 wherein said bismaleimide is decomposed in a nitrogen purge atmosphere.

19. The method of claim 15 wherein said troughs are formed with a dry etch process.

* * * * *